(12) United States Patent
Wang et al.

(10) Patent No.: US 10,795,231 B2
(45) Date of Patent: Oct. 6, 2020

(54) ARRAY SUBSTRATE AND MANUFACTURING METHOD THEREOF, DISPLAY PANEL AND MANUFACTURING METHOD THEREOF, AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Zhengkui Wang, Beijing (CN); Jian Sun, Beijing (CN); Yun Qiao, Beijing (CN); Han Zhang, Beijing (CN); Zhen Wang, Beijing (CN); Ruichao Liu, Beijing (CN); Jianjun Zhang, Beijing (CN); Peng Liu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 65 days.

(21) Appl. No.: 16/182,748

(22) Filed: Nov. 7, 2018

(65) Prior Publication Data
US 2019/0235333 A1    Aug. 1, 2019

(30) Foreign Application Priority Data
Feb. 1, 2018    (CN) .......................... 2018 1 0103036

(51) Int. Cl.
*G02F 1/1362*    (2006.01)
*G02F 1/1333*    (2006.01)
(Continued)

(52) U.S. Cl.
CPC ...... *G02F 1/136286* (2013.01); *G02F 1/1368* (2013.01); *G02F 1/13338* (2013.01);
(Continued)

(58) Field of Classification Search
CPC .......... G02F 1/136286; G02F 1/13338; G02F 1/133512; G02F 1/133516; G02F 1/13439;
(Continued)

(56) References Cited

U.S. PATENT DOCUMENTS 6,256,080 B1 *    7/2001    Colgan ............. G02F 1/133753
                                                        349/110
9,478,567 B1 *    10/2016    Jin ....................... H01L 27/1255
(Continued)

*Primary Examiner* — Ariel A Balaoing
(74) *Attorney, Agent, or Firm* — Brooks Kushman P.C.

(57) ABSTRACT

The present disclosure discloses an array substrate and its manufacturing method, a display panel and its manufacturing method, and a display device. The array substrate includes: a base substrate; a plurality of data lines; and a plurality of pixel units arranged on the base substrate, where each of the plurality of pixel units includes a plurality of subpixel units, and the plurality of subpixel units is in a one-to-one correspondence with the plurality of data lines, where each of the plurality of subpixel units includes a first subpixel unit and a second subpixel unit that are adjacently arranged, and the data line corresponding to the first subpixel unit and the data line corresponding to the second subpixel unit are both arranged at a position corresponding to a boundary between the first subpixel unit and the second subpixel unit.

16 Claims, 4 Drawing Sheets

(51) Int. Cl.
  *G02F 1/1343* (2006.01)
  *G02F 1/1368* (2006.01)
  *G02F 1/1335* (2006.01)
  *H01L 27/12* (2006.01)
  *G06F 3/041* (2006.01)

(52) U.S. Cl.
  CPC .... *G02F 1/13439* (2013.01); *G02F 1/133512* (2013.01); *G02F 1/133516* (2013.01); *G06F 3/0412* (2013.01); *H01L 27/124* (2013.01); *H01L 27/1288* (2013.01); *G02F 2001/136295* (2013.01); *G02F 2201/40* (2013.01); *G02F 2202/104* (2013.01); *H01L 27/1222* (2013.01)

(58) Field of Classification Search
  CPC ... G02F 1/1368; G06F 3/0412; H01L 27/124; H01L 27/1288
  See application file for complete search history.

(56) References Cited

U.S. PATENT DOCUMENTS

| | | | |
|---|---|---|---|
| 2009/0295692 A1* | 12/2009 | Lee | G02F 1/13338 345/87 |
| 2010/0201903 A1* | 8/2010 | Huang | G02F 1/136259 349/55 |
| 2013/0162693 A1* | 6/2013 | Li | G09G 3/2074 345/690 |
| 2013/0256707 A1* | 10/2013 | Chiang | H01L 27/1255 |
| 2014/0054624 A1* | 2/2014 | Chen | H01L 27/156 257/89 |
| 2015/0302808 A1* | 10/2015 | Wang | G02F 1/1335 345/691 |
| 2018/0314371 A1* | 11/2018 | Jin | G06F 3/044 |

* cited by examiner

ARRAY SUBSTRATE AND MANUFACTURING METHOD THEREOF, DISPLAY PANEL AND MANUFACTURING METHOD THEREOF, AND DISPLAY DEVICE

CROSS-REFERENCE TO RELATED APPLICATION

This application claims priority to Chinese Patent Application No. 201810103036.0 filed on Feb. 1, 2018, which is incorporated herein by reference in its entirety.

TECHNICAL FIELD

The present disclosure relates to the field of display, in particular to an array substrate and its manufacturing method, a display panel and its manufacturing method, and a display device.

BACKGROUND

A low temperature poly-silicon (LTPS) display screen has found wide applications due to its advantages of a high resolution, rapid response, high brightness, high aperture ratio, high migration ratio, or the like. An electron migration ratio of the LTPS display screen is about 100 times higher than that of an amorphous silicon display screen. Since its driving circuit may be directly manufactured on a panel (such as an array substrate), a number of its surrounding components may be reduced by 40%, with a very low failure rate, relatively high reliability, relatively low maintenance costs, and great advantages in system integration and space usage.

However, the LTPS display screen in the related art has a relatively low pixel aperture ratio, which causes a poor display effect, and the LTPS display screen still needs to be improved.

SUMMARY

In a first aspect, the present disclosure provides an array substrate. The array substrate includes:
a base substrate;
a plurality of data lines; and
a plurality of pixel units arranged on the base substrate, where each of the plurality of pixel units includes a plurality of subpixel units, and the plurality of subpixel units is in a one-to-one correspondence with the plurality of data lines, where each of the plurality of subpixel units includes a first subpixel unit and a second subpixel unit that are adjacently arranged, and the data line corresponding to the first subpixel unit and the data line corresponding to the second subpixel unit are both arranged at a position corresponding to a boundary between the first subpixel unit and the second subpixel unit.

In some optional embodiments, the plurality of subpixel units in each of the plurality of pixel units are arranged successively in a first direction, and in the first direction, the data line corresponding to the first subpixel unit is arranged at an edge of the first subpixel unit close to a side of the second subpixel unit, and the data line corresponding to the last subpixel unit is arranged at an edge of the last subpixel unit close to a side of the second last subpixel unit.

In some optional embodiments, each of the plurality of pixel units further includes a third subpixel unit, and the first subpixel unit, the second subpixel unit and the third subpixel unit are arranged successively. The data line corresponding to the third subpixel unit is arranged at an edge of the third subpixel unit close to a side of the second subpixel unit.

In some optional embodiments, the plurality of pixel units is arranged in an array, and each of the plurality of data lines is arranged at an edge of the corresponding subpixel unit.

In some optional embodiments, the plurality of data lines has a same width, there is a gap between the data line corresponding to the first subpixel unit and the data line corresponding to the second subpixel unit, and a width of the gap is equal to the width of one of the plurality of data lines.

In some optional embodiments, this array substrate further includes: a plurality strip-shaped touch electrodes, arranged on the same layer as the data lines, each of the plurality of pixel units is provided with at least one of the touch electrodes, the plurality of touch electrodes is arranged at edges of the plurality of subpixel units, and the data line corresponding to the subpixel unit provided with the touch electrode, and the data line corresponding to the subpixel unit adjacent to the touch electrode are both arranged at a side away from the touch electrode.

In some optional embodiments, this array substrate further includes: a plurality of thin film transistors, connected with the plurality of data lines in a one-to-one manner, and the plurality of thin film transistors and the plurality of data lines are arranged at a same side of the subpixel units.

In a second aspect, the present disclosure provides a display panel. According to the embodiments of the present disclosure, this display panel includes: the above-mentioned array substrate, and a color filter substrate, the color filter substrate and the array substrate oppositely arranged to form a cell.

In some optional embodiments, the color filter substrate includes:
a base substrate;
a color filter layer, arranged on the base substrate of the color filter substrate, including a plurality of color filter units arranged in an array, each of the plurality of color filter units including a plurality of color filter segments, and the plurality of color filter units arranged corresponding to the plurality of pixel units; and
a black matrix, arranged on the base substrate of the color filter substrate, where an orthographic projection of the black matrix on the base substrate of the color filter substrate, and an orthographic projection of the data line on the base substrate of the color filter substrate are at least partially overlapped,
where each of the plurality of color filter units includes two color filter segments that are arranged adjacently and have a same color, and there is no black matrix arranged between the two color filter segments.

In some optional embodiments, the plurality of color filter segments in each of the plurality of color filter units are arranged successively and have various colors, the number of the color filter segments having the same color is two, and in each of the plurality of color filter units, and there is at least one pair of the color filter segments that have the same color and are arranged adjacently.

In some optional embodiments, the array substrate includes a touch electrode, the color filter substrate includes:
a base substrate;
a color filter layer, arranged on the base substrate of the color filter substrate, including a plurality of color filter units arranged in an array, each of the plurality of color filter units including a plurality of color filter segments, and the plurality of color filter units arranged corresponding to the plurality of pixel units; and a black matrix, arranged on the base substrate of the color filter substrate, where an orthographic projection of the black matrix on the base substrate of the color filter substrate and an orthographic projection of the data line on the base substrate of the color filter substrate are at least partially overlapped, and the orthographic projection of the black matrix on the base substrate of the color filter substrate and an orthographic projection of the touch electrode on the base substrate of the color filter substrate are at least partially overlapped.

In a third aspect, the present disclosure provides a display device, including the above-mentioned display panel.

In a fourth aspect, the present disclosure provides a method for manufacturing an array substrate. According to the embodiments of the present disclosure, the method includes:

providing a base substrate;

arranging a plurality of pixel units on the base substrate, each of the plurality of pixel units including a plurality of subpixel units; and arranging a plurality of data lines on the base substrate by a patterning process, such that each of the subpixel units corresponds to one data line, where each of the plurality of subpixel units includes a first subpixel unit and a second subpixel unit that are adjacently arranged, and the data line corresponding to the first subpixel unit and the data line corresponding to the second subpixel unit are both arranged at a position corresponding to a boundary between the first subpixel unit and the second subpixel unit.

In some optional embodiments, this method further includes: arranging a plurality of strip-shaped touch electrodes on the base substrate, where the plurality of touch electrodes and the plurality of data lines are formed through a single patterning process, the plurality of touch electrodes is arranged at edges of the plurality of subpixel units, and the data line corresponding to the subpixel unit provided with the touch electrode, and the data line corresponding to the subpixel unit adjacent to the touch electrode are both arranged at a side away from the touch electrode.

In a fifth aspect, the present disclosure provides a method for manufacturing a display panel. This method includes:

manufacturing the array substrate implemented by the above-mentioned method;

manufacturing a color filter substrate; and oppositely arranging the array substrate and the color filter substrate to form a cell.

In some optional embodiments, the manufacturing the color filter substrate includes:

providing a base substrate of the color filter substrate;

arranging a color filter layer on the base substrate of the color filter substrate, the color filter layer including a plurality of color filter units arranged in an array, and each of the plurality of color filter units including a plurality of color filter segments; and arranging a black matrix on the base substrate of the color filter substrate, where an orthographic projection of the black matrix on the base substrate of the color filter substrate, and an orthographic projection of the data line on the base substrate of the color filter substrate are at least partially overlapped, where each of the plurality of color filter units includes two color filter segments that are arranged adjacently and have a same color, and there is no black matrix arranged between the two color filter segments.

BRIEF DESCRIPTION OF THE DRAWINGS

In order to more clearly explain the technical solutions of the embodiments of the present disclosure or in a related art, the drawings to be used in the descriptions of the embodiments or in the related art are briefly introduced as follows. Apparently, the following drawings merely illustrate some embodiments of the present disclosure, and a person skilled in the art can obtain other drawings from these drawings without any creative effort.

DETAILED DESCRIPTION

Figure 1:
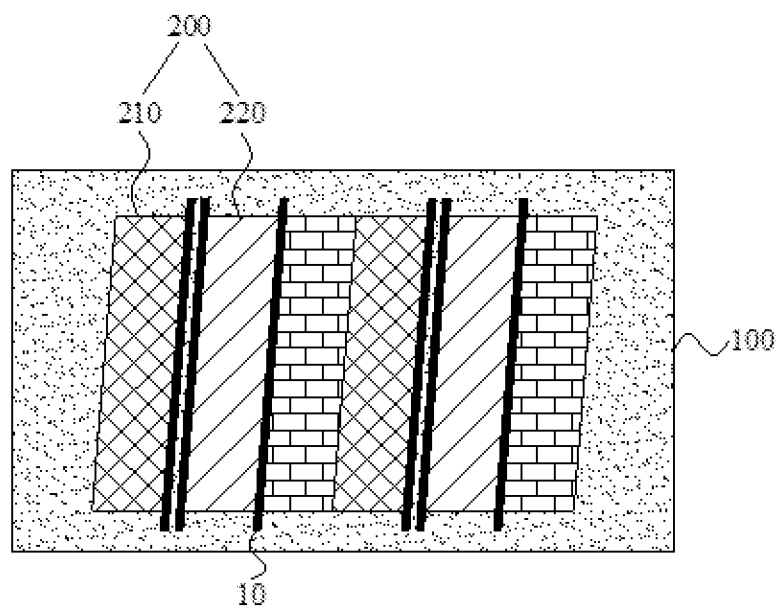
FIG. 1 is a structural schematic diagram of an array substrate according to at least one embodiment of the present disclosure.

The embodiments of the present disclosure are described in detail hereinafter. Examples of the described embodiments are given in the accompanying drawings, where the identical or similar reference numerals constantly denote the identical or similar elements or elements having the identical or similar functions. The specific embodiments described with reference to the attached drawings are all exemplary, and are intended to illustrate and interpret the present disclosure, which shall not be construed as causing limitations to the present disclosure.

Most LTPS display screens in the related art have the problem of poor display effects. After intensive studies and many experiments, the inventor found that the above-mentioned problem is mainly caused by a relatively low pixel aperture ratio of the LTPS display screen in the related art. For the LTPS display screen, the pixel aperture ratio is of great importance, because of its direct influence on a transmittance and a luminous efficacy of pixels. The inventor also found that in the RGB pixel design in the related art, due to the pixels blocked by the data line and the black matrix, the transmittance of the pixel would be reduced, thereby reducing the pixel aperture ratio, and then influencing the display effects of the LTPS display screen.

In one aspect, the present disclosure provides an array substrate. According to the embodiments of the present disclosure, referring to FIG. 1, the array substrate includes: a base substrate 100, a plurality of pixel units and a plurality of data lines 10. The plurality of pixel units is arranged in an array on the base substrate 100, each of the pixel units includes a plurality of subpixel units 200, each of the subpixel units 200 corresponds to one data line 10, and the first subpixel unit 210 and the second subpixel unit 220 of the pixel unit are arranged adjacently. The data line 10 corresponding to the first subpixel unit and the data line 10 corresponding to the second subpixel unit are both arranged at a position corresponding to a boundary between the first subpixel unit 210 and the second subpixel unit 220. At the boundary between the two adjacent subpixel units close to each other, two data lines are arranged. Since a plurality of subpixel units corresponds to the plurality of data lines one to one, in the subpixel units, there exist two adjacent subpixel units close to each other on the array substrate, the boundary between which is not provided with the data line. Therefore, a black matrix is not arranged, on the color filter substrate matching with this array substrate, at a position corresponding to the boundary between the two adjacent subpixel units where there is no the data line, thereby improving the aperture ratio of the pixel unit as an area of the black matrix decreases, and then improving the display quality of the display device using the above-mentioned array substrate and the color filter substrate.

For the sake of easy understanding, the array substrate according to the embodiments of the present disclosure will be explained below simply.

Figure 2:
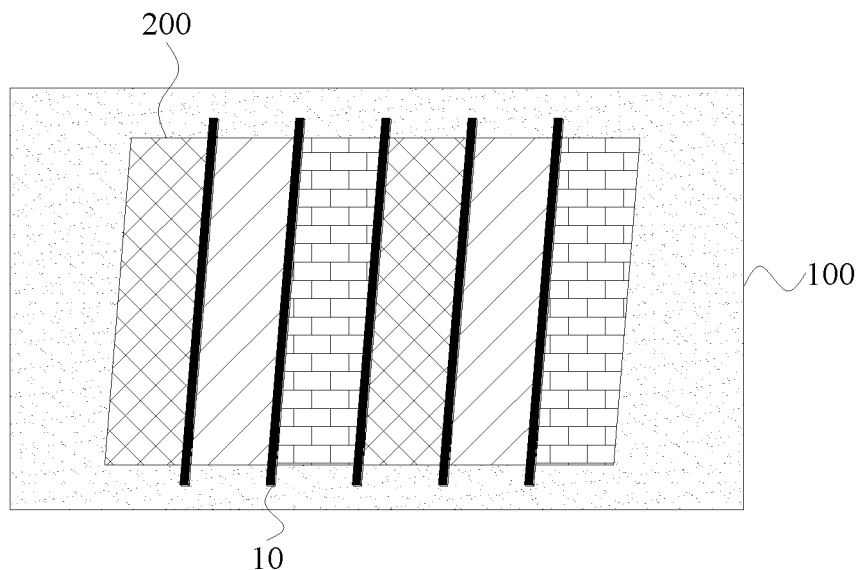
FIG. 2 is a structural schematic diagram of an array substrate in the related art.

In the RGB pixel design in the related art, referring to FIG. 2, each of the subpixel units 200 corresponds to one data line 10. Since part of the pixels is blocked by the data line 10 as well as the black matrix in the subsequent opposite arrangement of the color filter substrate to form a cell for the pixel unit, the transmittance of the pixel would be reduced, thereby reducing the aperture ratio of the pixel, and then influencing the display effects of the LTPS display screen.

According to embodiments of the present disclosure, two data lines are arranged at the edge of the two adjacent subpixel units close to each other. Since each of the subpixel units corresponds to one data line, there exist two adjacent subpixel units close to each other, the boundary between which is not provided with the data line. Therefore, a black matrix is not arranged, on the color filter substrate matching with this array substrate, at a position corresponding to the boundary between the two adjacent subpixel units where is not provided with the data line, thereby improving the aperture ratio of the pixel unit as an area of the black matrix decreases, further improving the display quality of the display device using the above-mentioned array substrate and the color filter substrate.

According to the embodiments of the present disclosure, each structure of this array substrate will be described in detail below.

Figure 3:
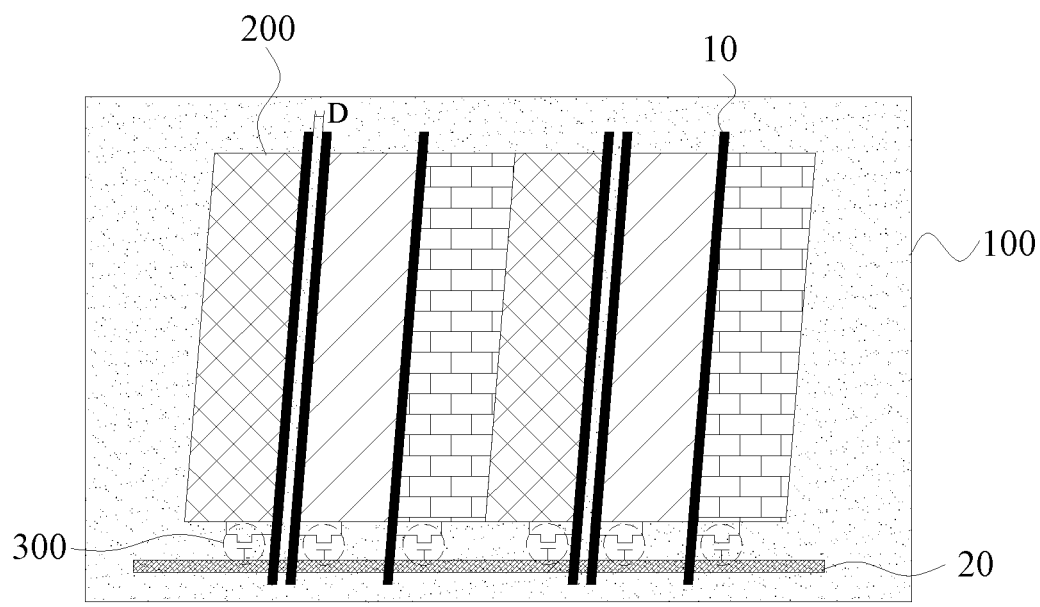
FIG. 3 is a structural schematic diagram of an array substrate according to at least one embodiment of the present disclosure.

According to the embodiments of the present disclosure, referring to FIG. 3, in order to prevent short circuits, a gap needs to be arranged between two adjacent data lines 10. The width D of this gap (as shown in FIG. 3) should be as small as possible, so as to reduce an area of a blocked region of the subpixel unit 200. The width of the gap is not limited, and may be designed by persons skilled in the art as needed. In some optional embodiments, the width of this gap may be the width of one data line. Thus, in the case of avoiding the short circuit between adjacent data lines, the region of the subpixel units blocked by the data lines and the black matrix is not too large, which improves the aperture ratio of the whole pixel units.

According to embodiments of the present disclosure, the plurality of subpixel units 200 is arranged successively, and in a direction where the subpixel units 200 are arranged, the data line 10 corresponding to the first subpixel unit 200 and the data line 10 corresponding to the last subpixel unit 200 are both arranged at a side away from the boundary of the pixel units. Therefore, there is no data line arranged at the boundary between the two adjacent pixel units, and for the color filter substrate matching with the array substrate, there is no black matrix at the corresponding position where there is no data line, thereby improving the aperture ratio of the pixel unit, and then improving the display quality of the display device using the above-mentioned array substrate and the color filter substrate.

The number of subpixel units constituting the pixel units is not limited, and may be designed by persons skilled in the art as needed. For example, for a three-primary-color (RGB) design, each pixel unit may include three subpixel units. For a four-primary-color (RGBW) design, each pixel unit includes four subpixel units. The embodiment according to the present disclosure is described by taking three primary colors as an example. Persons skilled in the art easily deduce a four-primary-color design solution, even a design solution of more primary colors, based on three primary colors. According to the embodiments of the present disclosure, this pixel unit includes three subpixel units 200 arranged successively. In a direction where the subpixel units 200 are arranged, the data line corresponding to the first subpixel unit is arranged at the edge of the first subpixel unit close to a side of the second subpixel unit; the data line corresponding to the second subpixel unit is arranged at the edge of the second subpixel unit close to a side of the first subpixel unit; and the data line corresponding to the third subpixel unit is arranged at the edge of the third subpixel unit close to a side of the second subpixel unit. Therefore, in each of the pixel units, the data line corresponding to the first subpixel unit and the data line corresponding to the last subpixel unit are both arranged at a side away from the boundary of the pixel units. Consequently, at the edge of the two subpixel units which close to each other and are located at the adjacent part of this pixel unit and the next pixel unit, i.e., at the edge of the third subpixel unit of this pixel unit and the first subpixel unit of the next pixel unit which close to each other, there is no data line. In the subsequent opposite arrangement to form a cell, a black matrix is not arranged at a position, corresponding to the edge between the two adjacent subpixel units where there is no data line, on the color filter substrate matched with the array substrate, which may reduce the area of the pixel units blocked by the data line and the black matrix, thereby increasing the aperture ratio of the pixel unit.

In some optional embodiments, the width of the data line may be 2 μm, and the width of the black matrix in the color filter substrate may be 4 μm. The orthographic projection of the single data line on the base substrate of the color filter substrate overlaps with that of the black matrix on the base substrate of the color filter substrate, or the orthographic projection of the black matrix on the base substrate of the color filter substrate is located within the orthographic projection of the two data lines at the boundary between the adjacent subpixel units on the base substrate of the color filter substrate. In the related art, referring to FIG. 2, each of the pixel units includes three subpixel units 200, each of which corresponds to one data line 10. In a direction where the subpixel units 200 are arranged, the width of each subpixel unit 200 blocked by each data line 10 is about 2 μm. After the opposite arrangement to form a cell, the width of each subpixel unit 200 blocked by the black matrix is about 4 μm. That is, the blocked width of each pixel unit in the related art is about 12 μm. According to the embodiments of the present disclosure, referring to FIG. 3, each of the pixel units includes three subpixel units 200, each of which corresponds to one data line 10. In a direction where the subpixel units 200 are arranged, there are two data lines at the boundary between the first subpixel unit and the second subpixel unit, the width of the first subpixel unit and the second subpixel unit blocked by the black matrix and the data lines is about 6 μm, the data line corresponding to the third subpixel unit is arranged at the edge of the third subpixel unit close to a side of the second subpixel unit, and the width of the third subpixel unit blocked by the data line and the black matrix is about 4 μm. That is, the blocked width of each pixel unit in the present embodiment is about 10 μm. With respect to the blocked width of 12 μm in the related art, the aperture ratio of the pixel unit in the embodiments of the present disclosure is improved.

The specific positions of the two data lines are not limited, and may be designed by persons skilled in the art as needed. For example, according to the embodiments of the present disclosure, in a direction where the subpixel units are arranged, two data lines may also be arranged at the edge between the second subpixel unit and the third subpixel unit close to each other, and the data line corresponding to the first subpixel unit is arranged at the edge of the first subpixel unit close to a side of the second subpixel unit. Thus, there is no data line at the boundary between this pixel unit the next pixel unit close to each other, thereby improving the aperture ratio of the pixel unit.

In some optional embodiments, referring to FIG. 3, this array substrate may further include a plurality of thin film transistors 300. A gate line 20 is configured to turn on or off the thin film transistors 300 to write a signal. In some optional embodiments, the thin film transistors 300 are connected with the data lines 10 one to one, and the thin film transistors 300 and the data lines 10 are located at the same side of their controlled subpixel units. Therefore, each thin film transistor may control one subpixel unit. Persons skilled in the art may understand that each of the thin film transistors 300 includes a gate electrode, a source electrode and a drain electrode, where the gate electrode is connected with the gate line 20, the source electrode is connected with the data line 10, and the drain electrode is connected with the subpixel unit 200.

Figure 4:
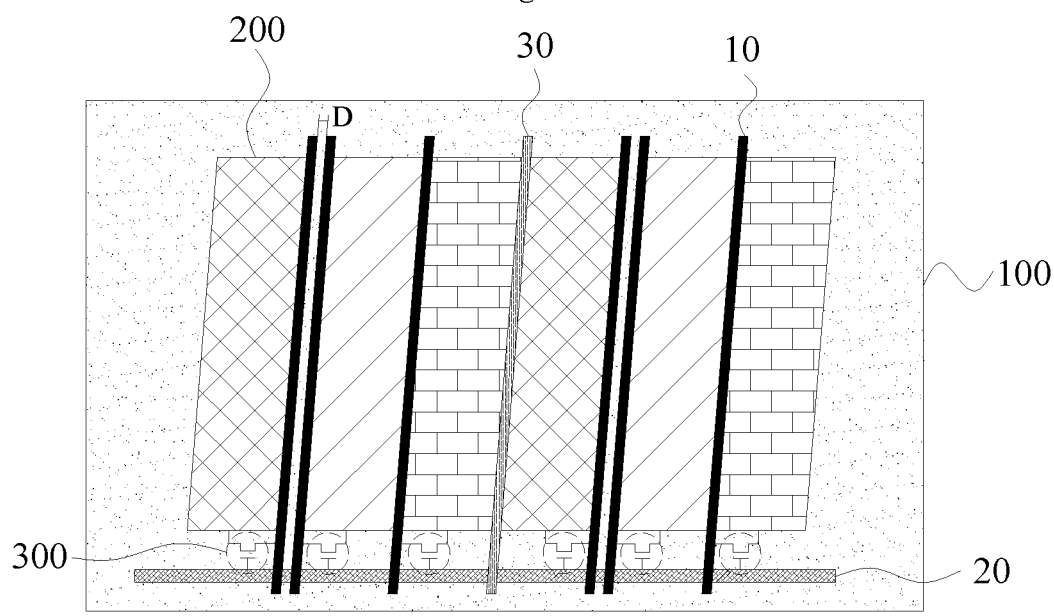
FIG. 4 is a structural schematic diagram of an array substrate according to at least one embodiment of the present disclosure.

Persons skilled in the art may understand that the touch electrode is arranged in the display panel, which may form the display panel with the touch function. The position of the touch electrode is not limited, and may be designed by persons skilled in the art as needed. In some optional embodiments, the touch electrode may be arranged on the array substrate on the same layer as the data line. Certainly, the touch electrode may also be arranged on different layers from the data line. In the embodiment, referring to FIG. 4, this array substrate may further include a plurality of strip-shaped touch electrodes 30, arranged on the same layer as the data lines 10. Each of the pixel units corresponds to at least one touch electrode 30. The touch electrodes 30 are arranged at the edge of the subpixel units 200. The data line corresponding to the subpixel unit provided with the touch electrode 30, and the data line provided with the subpixel unit adjacent to the touch electrode 30 are both arranged at a side away from the touch electrode 30. Therefore, when the touch electrode is arranged on the same layer as the data line, the width of the touch electrode may be increased, thereby improving sensitivity of the touch electrode.

In the related art, the touch electrodes and the data lines are both arranged at the edges between the two adjacent subpixel units close to each other. Taking the pixel aperture ratio into account, the width of the touch electrode may be limited, which reduces the touch sensitivity of the touch display device. According to the embodiment of the present disclosure, there exist two adjacent subpixel units close to each other on the array substrate, the boundary between which is not provided with the data line, and the touch electrode 30 is separately arranged at the boundary between two adjacent subpixel units where is not provided with a data line. Within the limit range of the black matrix width, the width of the touch electrode may be increased, thereby reducing the resistance of the touch electrode, and improving sensitivity of the touch electrode. Additionally, the touch electrode is arranged on the same layer as the data line, which may simplify the production process, shorten the production period, and lower production costs.

In another aspect, the present disclosure provides a display panel. According to the embodiments of the present disclosure, referring to FIG. 5, this display panel includes: the above-mentioned array substrate 1000 and a color filter substrate 2000, the color filter substrate 2000 and the array substrate 1000 oppositely arranged to form a cell. Therefore, this display panel has a relatively high pixel aperture ratio. Persons skilled in the art may understand that this display panel further includes liquid crystal molecules, arranged in a confined space (not shown in the drawing) between the array substrate 1000 and the color filter substrate 2000, so as to implement the display function of the display panel.

Figure 5:
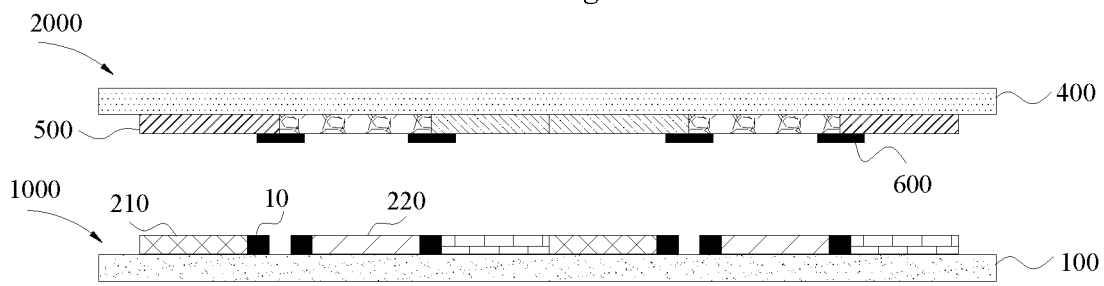
FIG. 5 is a structural schematic diagram of a display panel according to at least one embodiment of the present disclosure.

According to the embodiment of the present disclosure, referring to FIG. 5, the color filter substrate 2000 includes a base substrate 400, a color filter layer and a black matrix 600. The color filter layer is arranged on the base substrate of the color filter substrate 400, and includes a plurality of color filter units arranged in an array. Each of the color filter units includes a plurality of color filter segments 500, and the black matrix 600 is arranged on the base substrate of the color filter substrate 400. The orthographic projection of the single data line 10 on the base substrate of the color filter substrate 400 is located within that of the black matrix 600 on the base substrate of the color filter substrate 400, or the orthographic projection of the black matrix 600 on the base substrate of the color filter substrate 400 is located within the orthographic projection of the two data lines 10 at the boundary between the adjacent subpixel units on the base substrate of the color filter substrate. The plurality of color filter units is arranged corresponding to the plurality of pixel units. The color filter unit includes two color filter segments 500 which are arranged adjacently and have the same color. The black matrix 600 is arranged between the two color filter segments with different colors, and there is no black matrix 600 between the two color filter segments with the same color. The two color filter segments 500 with the same color are arranged adjacently, without the problem of cross color. Therefore, there is no black matrix arranged between two color filter segments which have the same color and are arranged adjacently, thereby reducing an area of the pixel units blocked by the black matrix, and improving the aperture ratio of the pixel units.

In the embodiments of the present disclosure, the color filter unit includes a plurality of the color filter segments 500 which are arranged successively and have various colors, and each of the colors includes two color filter segments 500. In the color filter units, there is at least one pair of the color filter segments 500 which have the same color and are arranged adjacently. For example, according to the embodiments of the present disclosure, in the RGB design, each color filter unit includes six color filter segments 500, in which two red color filter segments, two green color filter segments and two blue color filter segments are arranged successively, and the two color filter segments with the same color are arranged adjacently. For example, two blue color filter segments are arranged adjacently. Due to the same color of the color filter segments, the black matrix between the two above-mentioned color filter segments may be omitted. The two color filter segments which have the same color and are adjacent are arranged corresponding to the two adjacent subpixel units which are not provided with data lines at the edges close to each other in the array substrate 1000. According to the embodiments of the present disclosure, the orthographic projection of the single data line 10 on the base substrate of the color filter substrate 400 is located within that of the black matrix 600 on the base substrate of the color filter substrate 400, or the orthographic projection of the black matrix 600 on the base substrate of the color filter substrate 400 is located within the orthographic projection of the two data lines 10 at the boundary between the adjacent subpixel units on the base substrate of the color filter substrate. Therefore, the two adjacent subpixel units without a data line at the edges close to each other reduce the area of the pixel units blocked by the data line and the black matrix, which significantly increases the aperture ratio of the pixel unit.

Figure 6:
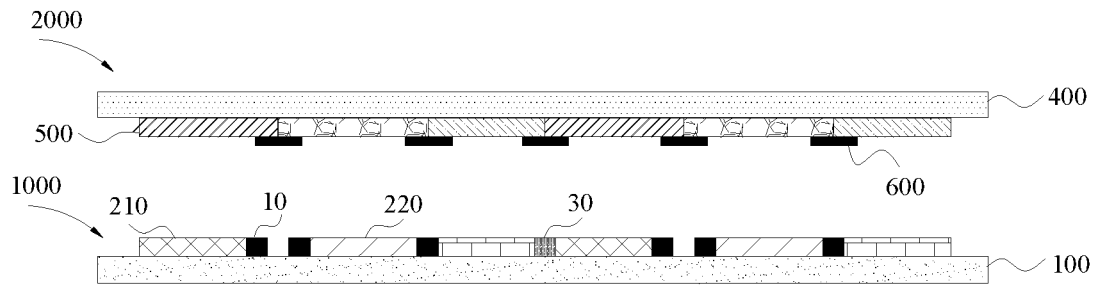
FIG. 6 is a structural schematic diagram of a display panel according to at least one embodiment of the present disclosure.
Figure 7:
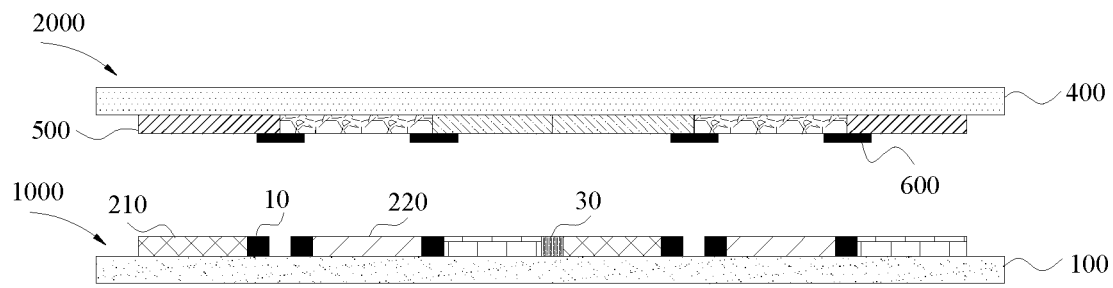
FIG. 7 is a structural schematic diagram of a display panel according to at least one embodiment of the present disclosure.

According to the embodiment of the present disclosure, referring to FIGS. 6 and 7, the array substrate 1000 may further include a touch electrode 30. In the case that the array substrate 1000 including the touch electrode 30 is used to constitute the display panel, not only the conventional color filter substrate (as shown in FIG. 6) but also the color filter substrate (as shown in FIG. 7) according to the embodiments of the present disclosure may be matched.

According to the embodiments of the present disclosure, referring to FIG. 6, the array substrate 1000 including the touch electrode 30 and the conventional color filter substrate 2000 are oppositely arranged to form a cell, so as to form a display panel. The color filter substrate 2000 includes: a color filter substrate base substrate 400, a color filter layer and a black matrix 600. The color filter layer is arranged on the base substrate of the color filter substrate 400, the color filter layer includes a plurality of color filter units arranged in an array, the color filter unit includes a plurality of color filter segments 500, the black matrix 600 is arranged on the base substrate of the color filter substrate 400, and the orthographic projection of the black matrix 600 on the base substrate of the color filter substrate 400 is located within the orthographic projection of the data line 10 and the touch electrode 30 on the base substrate of the color filter substrate 400. The touch electrode is arranged at the edge between the two adjacent subpixel units where no data line is arranged, and the width of the touch electrode may be increased, thereby increasing the touch sensitivity of the touch electrode.

According to the embodiment of the present disclosure, referring to FIG. 7, the array substrate 1000 including the touch electrode 30 and the color filter substrate 2000 according to the embodiment of the present disclosure are arranged oppositely to form a cell, so as to form the display panel, and two color filter segments 500 which have the same color and are arranged adjacently in the color filter substrate 2000 are arranged corresponding to the two adjacent subpixel units provided with the touch electrode 30. In some optional embodiments, the width of the touch electrode 30 is set to be the same as that of the data line 10. Therefore, the pixel aperture ratio of the display panel may be increased. According to other embodiments of the present disclosure, the width of the touch electrode 30 may be increased, and the touch sensitivity of the touch electrode may be improved.

There is no limit on the positional relationship between the black matrix and the base substrate of the color filter substrate as well as the color filter layer. For example, the black matrix may be located at a side of the color filter substrate away from the color filter layer, or at a side of the color filter layer away from the base substrate of the color filter substrate, as long as its use function may be implemented. Persons skilled in the art may design the positional relationship between the black matrix and the base substrate of the color filter substrate as well as the color filter layer as needed.

In another aspect, the present disclosure provides a display device. According to the embodiments of the present disclosure, this display device includes the above-mentioned display panel. Therefore, this display device has all features and advantages of the above-mentioned display panel, which are not repeated herein. To summary, this display device has relatively high display qualities.

Figure 8:
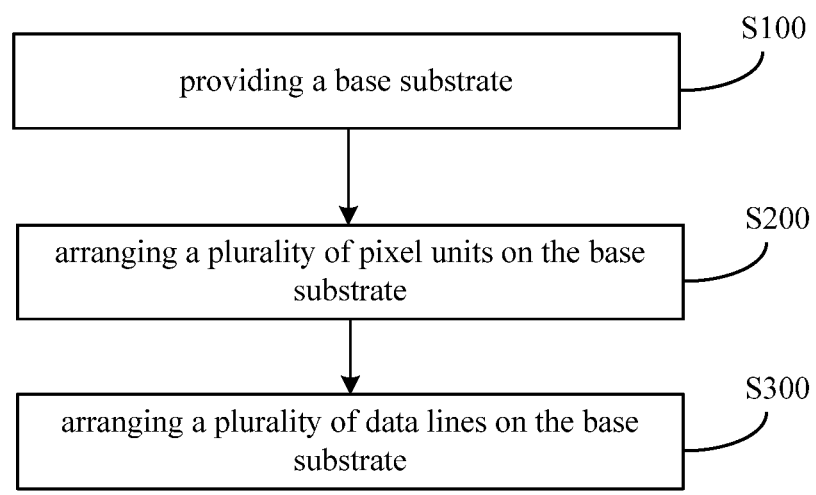
FIG. 8 is a schematic flow chart of a method for manufacturing an array substrate according to at least one embodiment of the present disclosure.

In another aspect, the present disclosure provides a method for manufacturing an array substrate. According to the embodiments of the present disclosure, the array substrate manufactured by this method may be the above-mentioned array substrate. Therefore, the array substrate manufactured by the method may have the same features and advantages as the above-mentioned array substrate, which is not repeated herein. According to the embodiment of the present disclosure, referring to FIG. 8, this method includes the steps S100 to S300.

S100: providing a base substrate.

According to the embodiment of the present disclosure, in this step, the base substrate is provided. The material of the base substrate is not limited, and may be designed by persons skilled in the art as needed. For example, according to the embodiments of the present disclosure, the base substrate may be made of glass.

S200: arranging a plurality of pixel units on the base substrate.

According to the embodiment of the present disclosure, in this step, the plurality of pixel units is arranged on the base substrate. The arrangement and constitution of the pixel units have been described in detail and are not repeated herein. For example, according to the embodiments of the present disclosure, the pixel units are arranged on the base substrate in an array, each of the pixel units includes three subpixel units, and the above-mentioned subpixel units are arranged in an array. According to the embodiments of the present disclosure, the manufacture of the pixel unit may be implemented by the following steps. Firstly, a layer of transparent conductive layer is deposited on the base substrate, for example an ITO layer, and then the pixel units arranged in an array are formed by the patterning process. The specific way of patterning process is not limited, and may be selected by persons skilled in the art as needed. For example, the pixel unit may be formed by a photolithography process.

S300: arranging a plurality of data lines on the base substrate.

According to the embodiment of the present disclosure, in this step, the plurality of data lines are arranged on the base substrate. According to the embodiment of the present disclosure, each subpixel unit corresponds to one data line. The position of the data line has been described in detail and is not repeated herein. For example, according to the embodiments of the present disclosure, each of the pixel units includes three subpixel units arranged successively. In a direction where the subpixel units are arranged, the data line corresponding to the first subpixel unit is arranged at the edge of the first subpixel unit close to a side of the second subpixel unit; the data line corresponding to the second subpixel unit is arranged at the edge of the second subpixel unit close to a side of the first subpixel unit; the data line corresponding to the third subpixel unit is arranged at the edge of the third subpixel unit close to a side of the second subpixel unit. Therefore, there is no data line arranged at the edge of two subpixel units which close to each other and are at a position where this pixel unit and the next pixel unit are adjacent, and for the color filter substrate matching with this array substrate, there is no black matrix at the corresponding position where there is no data line, thereby improving the aperture ratio of the pixel unit.

According to the embodiment of present disclosure, the data line is formed by the following steps. Firstly, a metal layer is deposited on the base substrate, and then based on a mask plate with a shape of the data line, using the patterning process, the data line is formed on the base substrate. According to the embodiment of the present disclosure, the data line is formed by using the photoetching process.

According to the embodiment of the present disclosure, this array substrate may further include a plurality of strip-shaped touch electrodes. The positions of the touch electrodes have been described in detail and are not repeated herein. For example, according to the embodiments of the present disclosure, the touch electrodes are arranged at the edges of the subpixel units, and the data line corresponding to the subpixel unit provided with the touch electrode and the data line corresponding to the subpixel unit adjacent to the touch pixel are both arranged at a side away from the touch electrode. Therefore, the width of the touch electrode may be increased, and the touch sensitivity of the touch electrode is improved. According to the embodiments of the present disclosure, the touch electrode and the data line are formed by the same one-time patterning process, i.e., based on the mask plate with the shape of the data line and the touch electrode, and the metal layer is photoetched, so as to synchronously form the touch electrode and the data line.

According to the embodiments of the present disclosure, the array substrate may further include a plurality of thin film transistors, connected with the data lines one to one, and each of the thin film transistors controls one subpixel unit. The positions of the thin film transistors have been described in detail and are not repeated herein. For example, according to the embodiments of the present disclosure, the thin film transistors and the data lines are located at the same side of their controlled subpixel units. The method for manufacturing the thin film transistor is conventional in the art, and will not be repeated herein.

In another aspect, the present disclosure provides a method for manufacturing a display panel. According to the embodiments of the present disclosure, the display panel manufactured by this method may be the above-mentioned display panel. Therefore, the display panel manufactured by the method may have the same features and advantages as the above-mentioned display panel, which is not repeated herein. According to the embodiment of the present disclosure, this method includes: manufacturing an array substrate, manufacturing a color filter substrate, and arranging oppositely the color filter substrate and the array substrate to form a cell. The manufacture of the array substrate is implemented by the above-mentioned method. Therefore, the display panel with a relatively high pixel aperture ratio may be obtained by a simple production process.

Figure 9:
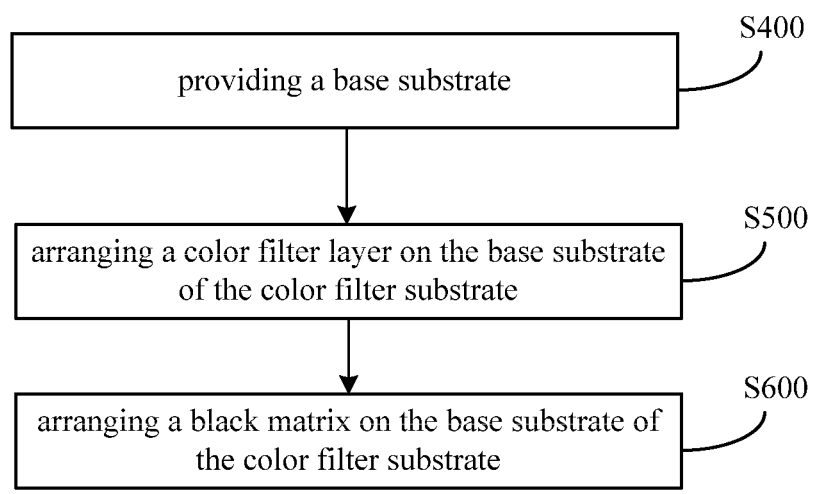
FIG. 9 is a schematic flow chart of a method for manufacturing a display panel according to at least one embodiment of the present disclosure.

According to the embodiments of the present disclosure, the color filter substrate which is oppositely arranged to the above-mentioned array substrate may be the above-mentioned color filter substrate. Therefore, this color filter substrate may have the same features and advantages as the above-mentioned array substrate, which is not repeated herein. According to the embodiment of the present disclosure, referring to FIG. 9, the manufacture of the color filter substrate in this method may be implemented by the following steps S400 to S600.

S400: providing a base substrate.

According to the embodiment of the present disclosure, in this step, the base substrate of the color filter substrate is provided. The material of the base substrate of the color filter substrate is not limited, and may be designed by persons skilled in the art as needed. For example, according to the embodiments of the present disclosure, the base substrate of the color filter substrate may be made of glass.

S500: arranging a color filter layer on the base substrate of the color filter substrate.

According to the embodiments of the present disclosure, in this step, a color filter layer is arranged on the base substrate of the color filter substrate. The constitution of the color filter layer has been described in detail and is not repeated herein. For example, according to the embodiments of the present disclosure, the color filter layer includes a plurality of color filter units, including the color filter segments which have various colors and are arranged successively. According to embodiments of the present disclosure, each of the color filter units may include six color filter segments, including two red color filter segments, two green color filter segments, and two blue color filter segments. There is a pair of color filter segments with the same color arranged adjacently, for example, the two blue color filter segments are arranged adjacently. Since the two adjacent color filter segments have the same color, the problem of cross color does not occur. Therefore, there is no black matrix between the two adjacent color filter segments which have the same color and are arranged adjacently, and the two color filter segments which have the same color and are arranged adjacently are arranged corresponding to the two adjacent subpixel units which are not provided with data lines at the edges close to each other on the array substrate. Therefore, the aperture ratio of the pixel unit may be improved.

According to the embodiment of the present disclosure, the color filter layer may be formed by the following steps. Firstly, a layer of red color filter glue is deposited on the base substrate of the color filter substrate, and then using the mask plate with the shape of the red color filter segment, the red color filter glue is patterned, so as to form the red color filter segment. Then, a layer of green color filter glue is deposited on the base substrate of the color filter substrate, and then using the mask plate with the shape of the green color filter segment, the green color filter glue is patterned, so as to form the green color filter segment. Finally, a layer of blue color filter glue is deposited on the base substrate of the color filter substrate, and then using the mask plate with the shape of the blue color filter segment, the blue color filter glue is patterned, so as to form the blue color filter segment. Therefore, using the simple production process, the color filter layers of the color filter segments which have the same color and are arranged adjacently may be formed.

S600: arranging a black matrix on the base substrate of the color filter substrate.

According to the embodiments of the present disclosure, in this step, a black matrix is arranged on the base substrate of the color filter substrate. The position of the black matrix has been described in detail and is not repeated herein. For example, according to the embodiment of the present disclosure, the orthographic projection of the black matrix on the base substrate of the color filter substrate is located within the orthographic projection of the data line on the base substrate of the color filter substrate, and there is no black matrix between two color filter segments which have the same color and are arranged adjacently. This color filter substrate is used with the array substrate, which may increase the aperture ratio of the pixel unit, and improve the display quality of the display device.

The manufacture order of the color filter layer and the black matrix is not limited, and may be designed by persons skilled in the art as needed. For example, according to some other embodiments of the present disclosure, the black matrix may be formed on the base substrate of the color filter substrate firstly, and then the color filter layer is formed.

In the description of the present disclosure, the terms indicating an orientation or position relationship such as "upper", "lower" are those based on the drawings, merely to simply describe the present disclosure, instead of requiring that the present disclosure must be configured and operated in the specific orientation, and therefore should not be constructed as a limit to the present disclosure.

In the description of the present specification, reference terms such as "an embodiment", "another embodiment", or the like are intended to refer to that the specific features, structures, materials, or characteristics which are described in combination with the embodiments are included in at least one embodiment of the present disclosure. In this specification, schematic expressions of the above terms do not necessarily indicate the same embodiments or examples. In addition, the described specific features, structures, materials, or characteristics may be combined in any one or multiple embodiments or examples in a suitable way. In addition, in case of no contradiction, a person skilled in the art may incorporate or combine different embodiments or examples and features of different embodiments or examples described in this specification. In addition, terms of "first", "second" are only used for description, but shall not be understood as indication or implication of relative importance or implicit indication of the number of the specific technical features.

The above are merely the optional embodiments of the present disclosure. A person skilled in the art may make further modifications and improvements without departing from the principle of the present disclosure, and these modifications and improvements shall also fall within the scope of the present disclosure.

What is claimed is:

1. An array substrate, comprising:
   a base substrate;
   a plurality of data lines;
   a plurality of pixel units arranged on the base substrate, wherein each of the plurality of pixel units comprises a plurality of subpixel units, and the plurality of subpixel units is in a one-to-one correspondence with the plurality of data lines; and
   a plurality of strip-shaped touch electrodes, arranged on a same layer as the plurality of data lines,
   wherein each of the plurality of subpixel units comprises a first subpixel unit and a second subpixel unit that are adjacently arranged, and the data line corresponding to the first subpixel unit, and the data line corresponding to the second subpixel unit are both arranged at a position corresponding to a boundary between the first subpixel unit and the second subpixel unit,
   wherein the plurality of subpixel units in each of the plurality of pixel units are arranged and numbered successively in a first direction, in the first direction, the data line corresponding to the first subpixel unit is arranged at an edge of the first subpixel unit close to the second subpixel unit, and the data line corresponding to the last subpixel unit is arranged at an edge of the last subpixel unit close to the second last subpixel unit,
   wherein an arrangement manner of data lines corresponding to the plurality of subpixel units in any pixel unit is the same as an arrangement manner of data lines corresponding to the plurality of subpixel units in any other pixel unit, and
   wherein each of the plurality of pixel units is provided with at least one touch electrode, and the touch electrode corresponding to each pixel unit is arranged at an edge of the last subpixel unit away from the second last subpixel unit of the each pixel unit.

2. The array substrate according to claim 1, wherein each of the plurality of pixel units further comprises a third subpixel unit, and the first subpixel unit, the second subpixel unit and the third subpixel unit are arranged successively, and
   the data line corresponding to the third subpixel unit is arranged at an edge of the third subpixel unit close to the second subpixel unit.

3. The array substrate according to claim 1, wherein the plurality of pixel units is arranged in an array, and each of the plurality of data lines is arranged at an edge of the corresponding subpixel unit.

4. The array substrate according to claim 1, wherein the plurality of data lines has a same width, there is a gap between the data line corresponding to the first subpixel unit and the data line corresponding to the second subpixel unit, and a width of the gap is equal to the width of one of the plurality of data lines.

5. The array substrate according to claim 1, further comprising:
   a plurality of thin film transistors, connected with the plurality of data lines in a one-to-one manner, wherein the plurality of thin film transistors and the plurality of data lines are arranged at a same side of the subpixel units.

6. A display panel, comprising:
   an array substrate; and
   a color filter substrate, the color filter substrate and the array substrate arranged oppositely to form a cell,
   wherein the array substrate comprises:
      a base substrate;
      a plurality of data lines; and
      a plurality of pixel units arranged on the base substrate, wherein each of the plurality of pixel units comprises a plurality of subpixel units, and the plurality of subpixel units is in a one-to-one correspondence with the plurality of data lines; and
      a plurality of strip-shaped touch electrodes, arranged on a same layer as the plurality of data lines,
      wherein each of the plurality of subpixel units comprises a first subpixel unit and a second subpixel unit that are adjacently arranged, and the data line corresponding to the first subpixel unit and the data line corresponding to the second subpixel unit are both arranged at a position corresponding to a boundary between the first subpixel unit and the second subpixel unit,
      wherein the plurality of subpixel units in each of the plurality of pixel units are arranged and numbered successively in a first direction, in the first direction, the data line corresponding to the first subpixel unit is arranged at an edge of the first subpixel unit close to the second subpixel unit, and the data line corresponding to the last subpixel unit is arranged at an edge of the last subpixel unit close to the second last subpixel unit, wherein an arrangement manner of data lines corresponding to the plurality of subpixel units in any pixel unit is the same as an arrangement manner of data lines corresponding to the plurality of subpixel units in any other pixel unit, and wherein each of the plurality of pixel units is provided with at least one touch electrode, and the touch electrode corresponding to each pixel unit is arranged at an edge of the last subpixel unit away from the second last subpixel unit of the each pixel unit.

7. The display panel according to claim 6, wherein each of the plurality of pixel units further comprises a third subpixel unit, and the first subpixel unit, the second subpixel unit and the third subpixel unit are arranged successively, the data line corresponding to the third subpixel unit is arranged at an edge of the third subpixel unit close to the second subpixel unit.

8. The display panel according to claim 6, wherein the plurality of data lines has a same width, there is a gap between the data line corresponding to the first subpixel unit and the data line corresponding to the second subpixel unit, and a width of the gap is equal to the width of one of the plurality of data lines.

9. The display panel according to claim 6, wherein the color filter substrate comprises:

a base substrate;

a color filter layer, arranged on the base substrate of the color filter substrate, comprising a plurality of color filter units arranged in an array, each of the plurality of color filter units comprising a plurality of color filter segments, and the plurality of color filter units arranged corresponding to the plurality of pixel units; and a black matrix, arranged on the base substrate of the color filter substrate, wherein an orthographic projection of the black matrix on the base substrate of the color filter substrate, and an orthographic projection of the data line on the base substrate of the color filter substrate are at least partially overlapped, wherein each of the plurality of color filter units comprises two color filter segments that are arranged adjacently and have a same color, and there is no black matrix arranged between the two color filter segments.

10. The display panel according to claim 9, wherein the plurality of color filter segments in each of the plurality of color filter units are arranged successively and have various colors, the number of the color filter segments having the same color is two, and in each of the plurality of color filter units, and there is at least one pair of the color filter segments that have the same color and are arranged adjacently.

11. The display panel according to claim 6, wherein the color filter substrate comprises:

a base substrate;

a color filter layer, arranged on the base substrate of the color filter substrate, comprising a plurality of color filter units arranged in an array, each of the plurality of color filter units comprising a plurality of color filter segments, and the plurality of color filter units arranged corresponding to the plurality of pixel units; and a black matrix, arranged on the base substrate of the color filter substrate, wherein an orthographic projection of the black matrix on the base substrate of the color filter substrate and an orthographic projection of the data line on the base substrate of the color filter substrate are at least partially overlapped, and the orthographic projection of the black matrix on the base substrate of the color filter substrate and an orthographic projection of the touch electrode on the base substrate of the color filter substrate are at least partially overlapped.

12. A display device, comprising the display panel according to claim 6.

13. A method for manufacturing an array substrate, comprising:

providing a base substrate;

arranging a plurality of pixel units on the base substrate, each of the plurality of pixel units comprising a plurality of subpixel units;

arranging a plurality of data lines on the base substrate by a patterning process, such that each of the subpixel units corresponds to one data line; and arranging a plurality of strip-shaped touch electrodes on the base substrate, wherein each of the plurality of subpixel units comprises a first subpixel unit and a second subpixel unit that are adjacently arranged, and the data line corresponding to the first subpixel unit and the data line corresponding to the second subpixel unit are both arranged at a position corresponding to a boundary between the first subpixel unit and the second subpixel unit, wherein the plurality of subpixel units in each of the plurality of pixel units are arranged and numbered successively in a first direction, in the first direction, the data line corresponding to the first subpixel unit is arranged at an edge of the first subpixel unit close to the second subpixel unit, and the data line corresponding to the last subpixel unit is arranged at an edge of the last subpixel unit close to the second last subpixel unit, wherein an arrangement manner of data lines corresponding to the plurality of subpixel units in any pixel unit is the same as an arrangement manner of data lines corresponding to the plurality of subpixel units in any other pixel unit, and wherein each of the plurality of pixel units is provided with at least one touch electrode, and the touch electrode corresponding to each pixel unit is arranged at an edge of the last subpixel unit away from the second last subpixel unit of the each pixel unit.

14. The method according to claim 13, wherein the plurality of touch electrodes and the plurality of data lines are formed through a single patterning process.

15. A method for manufacturing a display panel, comprising:

manufacturing the array substrate by using the method according to claim 13;

manufacturing a color filter substrate; and oppositely arranging the array substrate and the color filter substrate to form a cell.

16. The method according to claim 15, wherein the manufacturing the color filter substrate comprises:

providing a base substrate of the color filter substrate;

arranging a color filter layer on the base substrate of the color filter substrate, the color filter layer comprising a plurality of color filter units arranged in an array, and each of the plurality of color filter units comprising a plurality of color filter segments; and arranging a black matrix on the base substrate of the color filter substrate, wherein an orthographic projection of the black matrix on the base substrate of the color filter substrate, and an orthographic projection of the data line on the base substrate of the color filter substrate are at least partially overlapped,
wherein each of the plurality of color filter units comprises two color filter segments that are arranged adjacently and have a same color, and there is no black matrix arranged between the two color filter segments.

* * * * *